United States Patent
Tang

(10) Patent No.: US 7,929,343 B2
(45) Date of Patent: Apr. 19, 2011

(54) METHODS, DEVICES, AND SYSTEMS RELATING TO MEMORY CELLS HAVING A FLOATING BODY

(75) Inventor: Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 52 days.

(21) Appl. No.: 12/419,658

(22) Filed: Apr. 7, 2009

(65) Prior Publication Data
US 2010/0254186 A1    Oct. 7, 2010

(51) Int. Cl.
*G11C 11/34* (2006.01)
(52) U.S. Cl. .............. 365/176; 365/182; 365/185.01; 365/177; 365/185.26; 365/183
(58) Field of Classification Search ............... 365/176, 365/182, 185.01, 177, 183, 185.26; 257/758, 257/347
See application file for complete search history.

(56) References Cited

U.S. PATENT DOCUMENTS

| | | | |
|---|---|---|---|
| 6,621,725 B2 | 9/2003 | Ohsawa | |
| 7,184,312 B2 | 2/2007 | Bhattacharyya | |
| 7,440,317 B2 | 10/2008 | Bhattacharyya | |
| 7,463,523 B2 | 12/2008 | Shino | |
| 7,586,153 B2 | 9/2009 | Hoentschel et al. | |
| 7,608,927 B2 * | 10/2009 | Gonzalez et al. | 257/758 |
| 7,741,673 B2 | 6/2010 | Tak et al. | |
| 2006/0006468 A1 | 1/2006 | Fazan et al. | |
| 2007/0012988 A1 | 1/2007 | Bhattacharyya | |
| 2007/0138530 A1 | 6/2007 | Okhonin | |
| 2007/0200157 A1 | 8/2007 | Shino | |
| 2008/0061346 A1 | 3/2008 | Tang et al. | |
| 2008/0099811 A1 | 5/2008 | Tak et al. | |
| 2008/0205133 A1 | 8/2008 | Gonzalez et al. | |
| 2009/0002654 A1 | 1/2009 | Warrick et al. | |
| 2009/0010056 A1 | 1/2009 | Kuo et al. | |
| 2009/0016101 A1 | 1/2009 | Okhonin et al. | |

(Continued)

FOREIGN PATENT DOCUMENTS

KR    10-2000-0016924 A    3/2000

(Continued)

OTHER PUBLICATIONS

Ban et al., A Scaled Floating Body Cell (FBC) Memory with High-k+Metal Gate on Thin-Silicon and Thin-BOX for 16-nm Technology Node and Beyond, 2008 Symposium on VLSI Technology Digest of Technical Papers, pp. 92-93.

(Continued)

*Primary Examiner* — Thong Q Le
(74) *Attorney, Agent, or Firm* — TraskBritt

(57) ABSTRACT

Methods, devices, and systems are disclosed relating to a memory cell having a floating body. A memory cell includes a transistor comprising a drain and a source each formed in silicon and a gate positioned between the drain and the source. The memory cell may further include a bias gate recessed into the silicon and positioned between an isolation region and the transistor. In addition, the bias gate may be configured to be operably coupled to a bias voltage. The memory cell may also include a floating body within the silicon. The floating body may include a first portion adjacent the source and the drain and vertically offset from the bias gate and a second portion coupled to the first portion. Moreover, the bias gate may be formed adjacent to the second portion.

25 Claims, 11 Drawing Sheets

U.S. PATENT DOCUMENTS

| | | |
|---|---|---|
| 2009/0022003 A1 | 1/2009 | Song et al. |
| 2010/0246285 A1 | 9/2010 | Tang et al. |

FOREIGN PATENT DOCUMENTS

| | | |
|---|---|---|
| KR | 10-0612710 B1 | 8/2000 |
| KR | 10-2000-0056248 A | 9/2000 |
| KR | 10-2004-0108552 A | 12/2004 |

OTHER PUBLICATIONS

Rancia et al., Scaled 1T-Bulk Devices Built with CMOS 90nm Technology for Low-Cost eDRAM Applications, 2005 Symposium on VLSI Technology Digest of Technical Papers, pp. 38-39.

Okhonin et al., New Generation of Z-RAM, 2007, IEEE, pp. 925-928.

Butt et al., Scaling Limits of Double-Gate and Surround-Gate Z-RAM Cells, IEEE Transactions on Electron Devices, vol. 54, No. 9, Sep. 2007, pp. 2255-2262.

Nagoga et al., Retention Characteristics of Zero-Capacitor RAM (Z-RAM) Cell Based on FinFET and Tri-Gate Devices, 2005 IEEE International SOI Conferences, pp. 203-204.

International Search Report for International Application No. PCT/US2010/029755 mailed Nov. 8, 2010, 7 pages.

International Written Opinion for International Application No. PCT/US2010/029755 mailed Nov. 8, 2010, 3 pages.

International Search Report for International Application No. PCT/US2010/027507 mailed Oct. 26, 2010, 3 pages.

International Written Opinion for International Application No. PCT/US2010/027507 mailed Oct. 26, 2010, 4 pages.

\* cited by examiner

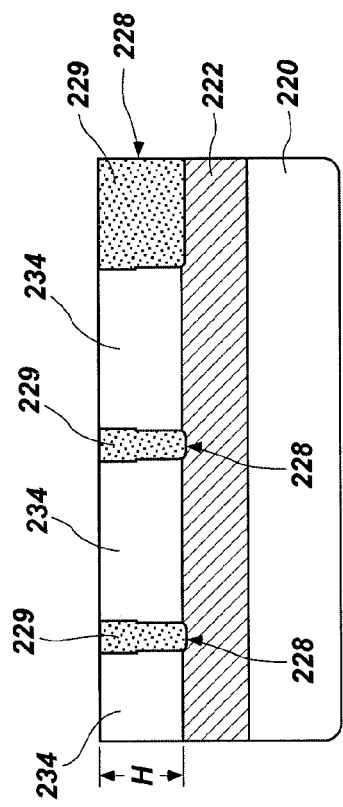
FIG. 4A
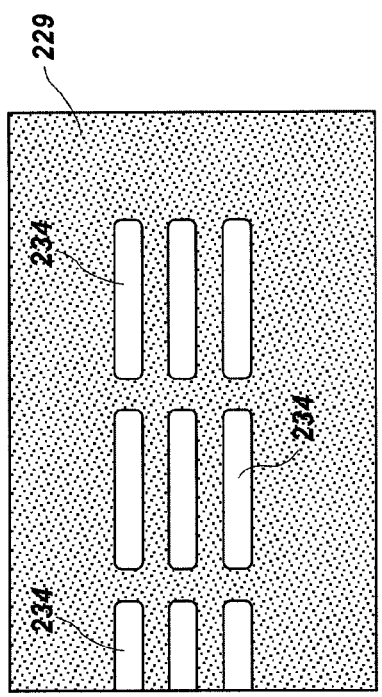
FIG. 5A
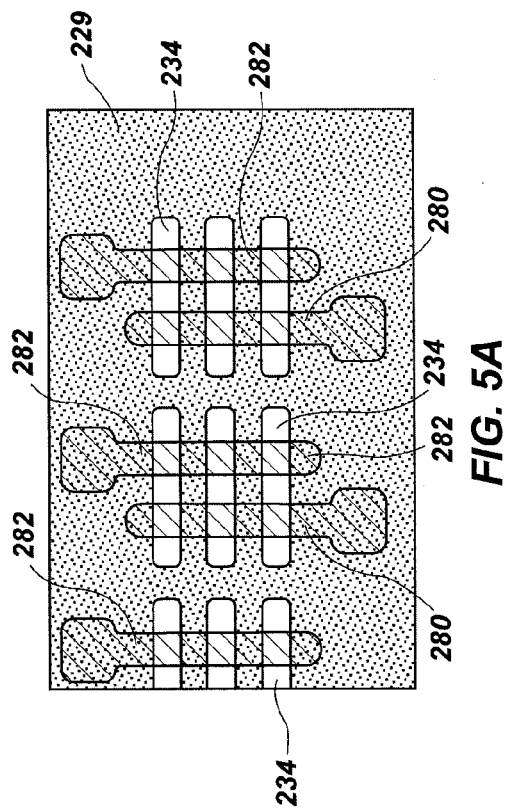
FIG. 4B
FIG. 5B

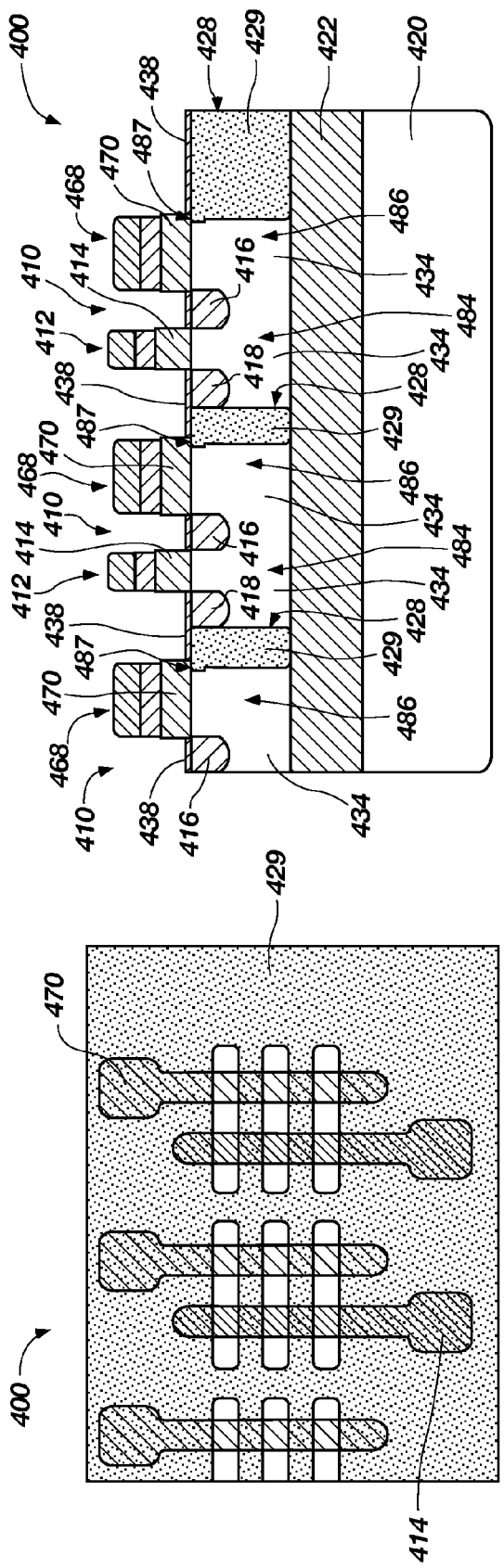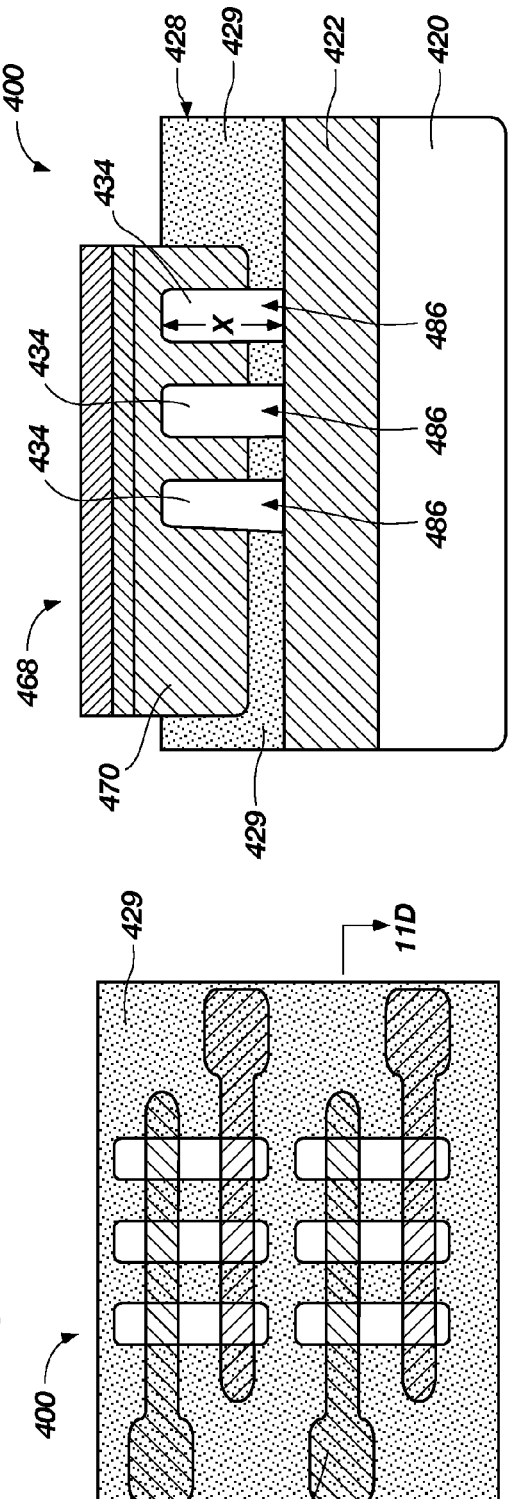

us 7,929,343 B2

METHODS, DEVICES, AND SYSTEMS RELATING TO MEMORY CELLS HAVING A FLOATING BODY

CROSS-REFERENCE TO RELATED APPLICATIONS

This application is related to copending U.S. patent application Ser. No. 12/410,207, filed Mar. 24, 2009.

TECHNICAL FIELD

Embodiments of the present invention relate generally to memory cells. More particularly, embodiments of the present invention relate to memory cells having a floating body, to devices and systems utilizing same, and to methods of forming and methods of operating same.

BACKGROUND

A conventional memory, for example, a DRAM, may include one transistor and one capacitor. However, there are limitations to the scalability of a conventional memory, due to the presence of the capacitor and, in particular, the size of the capacitor. As a result, memories including one transistor (IT) and no capacitor as a memory cell, referred to as "capacitor-less" memories, have been developed. A capacitor-less memory cell may include a floating body (i.e., a body that is electrically floated).

Generally, a conventional capacitor-less memory cell utilizes a silicon-on-insulator (SOI) wafer and identifies data controlling the floating body voltage by accumulating a majority carrier (either holes or electrons) in a floating body or by emitting the majority carrier from the floating body. As understood by a person having ordinary skill in the art, a logic "1" may be written to and stored in a memory cell by causing majority carriers to accumulate and be held in the floating body. As such, when the majority carrier is accumulated in the floating body, this state is generally referred to as a data "1" state. A logic "1" may be erased (i.e., logic "0" is written) by removing the majority carriers from the floating body. As such, when the majority carrier is evacuated from the floating body, this state is generally referred to as a data "0" state. As also understood by a person having ordinary skill in the art, the stored charge in the transistor floating body affects the threshold voltage ($V_T$) of the memory cell transistor. A lower threshold voltage ($V_T$) increases the current through the memory cell transistor, and a higher threshold voltage ($V_T$) decreases the current though the transistor. The current through the memory cell transistor is used to determine the state of the memory cell.

FIG. 1 illustrates an example of a conventional floating body memory cell 10. Memory cell 10 includes a transistor 12 having a gate region 16, a source region 18, and a drain region 20. Source region 18 and drain region 20 are formed in silicon layer 26 with a floating body region 24 being defined therebetween. Moreover, floating body region 24 is disposed on an insulating layer 28 which overlies a substrate 30. Memory cell 10 also includes a region 38 comprising silicon which is highly positively doped compared to floating body region 24, but less positively doped than source region 18 or drain region 20. Region 38 is connected to a contact 40 by means of conductive line 41 passing through insulating layer 28, silicon layer 26, and an insulating layer 32. By applying a negative voltage to region 38, typically in the region of −20V for insulation layer 28 having a thickness of 400 nanometers, a neutral zone may be formed in floating body region 24. Therefore, it is possible to generate and store an electrical charge within floating body region 24.

As illustrated above, a conventional floating body memory cell stores charges within a floating body that is adjacent to the drain and source regions and, therefore, the stored charges have a tendency to leak out of the floating body during operation. This is particularly an issue during operations at higher temperatures. Additionally, conventional floating body memory cells suffer from poor data retention due to charge lost from the floating body upon charge recombination during hold, read, and write operations. Furthermore, because conventional floating body memory cells may have a small floating body which is not configured to hold a substantial charge, any charge lost may result in a fluctuating or weakened signal.

There is a need for methods, devices, and systems for enhancing the functionality of floating body memory cells. Specifically, there is a need for methods, devices, and systems for enhancing the functionality of a memory cell by increasing the size of a floating body of a memory cell and increasing data retention by a floating body memory cell.

BRIEF DESCRIPTION OF THE DRAWINGS

FIGS. 4A and 4B respectively illustrate a plan view and a cross-sectional view of a formation of a structure, in accordance with an embodiment of the present invention;

FIG. 5A is a plan view of further formation of the structure of FIG. 4A, in accordance with an embodiment of the present invention;

FIG. 5B is a cross-sectional view of further formation of the structure of FIG. 4B, in accordance with an embodiment of the present invention;

FIG. 11A is a plan view of a formation of a structure, in accordance with another embodiment of the present invention;

FIG. 11B is a cross-sectional view of a formation of the structure illustrated in FIG. 11A, in accordance with an embodiment of the present invention;

FIG. 11C is another plan view of the structure illustrated in FIG. 11A and rotated ninety degrees with respect to FIG. 11A;

FIG. 11D is another cross-sectional view of the structure illustrated in FIG. 11B and rotated ninety degrees with respect to FIG. 11B;

DETAILED DESCRIPTION

Figure 1:
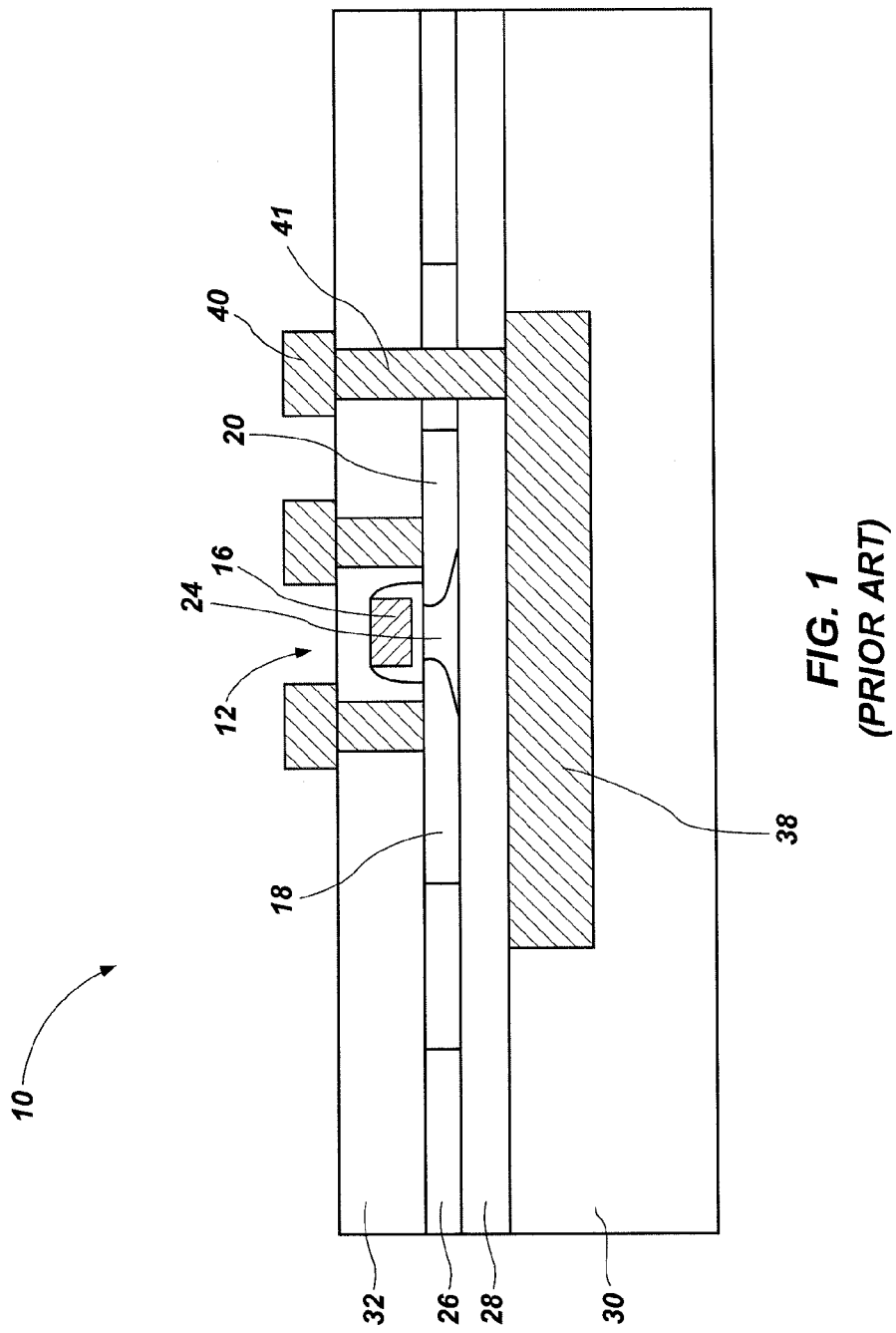
FIG. 1 illustrates a conventional floating body memory cell.

In the following detailed description, reference is made to the accompanying drawings which form a part hereof and, in which is shown by way of illustration, specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the disclosure.

In this description, functions may be shown in block diagram form in order not to obscure the present invention in unnecessary detail. Furthermore, specific implementations shown and described are only examples and should not be construed as the only way to implement the present invention unless specified otherwise herein. Block definitions and partitioning of logic between various blocks represent a specific implementation. It will be readily apparent to one of ordinary skill in the art that the various embodiments of the present invention may be practiced by numerous other partitioning solutions. For the most part, details concerning timing considerations, and the like, have been omitted where such details are not necessary to obtain a complete understanding of the present invention in its various embodiments and are within the abilities of persons of ordinary skill in the relevant art.

The terms "wafer" and "substrate" used in the following description include any structure having an exposed surface, on or in which an integrated circuit (IC) structure relating to embodiments of the present invention may be formed. The term "substrate" includes, without limitation, semiconductor wafers and other bulk semiconductor substrates. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures known to one skilled in the art. The term "conductor" includes semiconductors, and the term "insulator" or "dielectric" includes any material that is less electrically conductive than the materials referred to herein as conductors.

Referring in general to the following description and accompanying drawings, various aspects of the present invention are illustrated to show its structure and method of operation. Common elements of the illustrated embodiments are designated with like numerals. It should be understood the figures presented are not meant to be illustrative of actual views of any particular portion of the actual structure or method, but are merely idealized representations which are employed to more clearly and fully depict the present invention.

A memory cell including a floating body and a memory array including a plurality of memory cells, according to various embodiments of the present invention, will first be described with reference to FIGS. 2 and 3. Methods of forming a memory array including a plurality of memory cells, in accordance with various embodiments of the present invention, will then be described with reference to FIGS. 4A-10B. Memory arrays including a plurality of memory cells, according to other embodiments of the present invention, will then be described with reference to FIGS. 11A-12B. Thereafter, various operations of a memory cell, in accordance with an embodiment of the present invention, will then be described with reference to FIG. 13. Furthermore, with reference to FIGS. 14 and 15, an electronic system and a semiconductor wafer, each incorporating a memory array and memory cells of one or more of the previous embodiments will be described.

It should be noted that although the following described embodiments of the present invention comprise one or more NMOS transistors, other transistors known by one of ordinary skill such as PMOS transistors may be used in carrying out various embodiments of the present invention. Furthermore, although the following described embodiments of the present invention refer to "hole generation" or "holes" acting as majority carriers, it will be understood by a person of ordinary skill in the art that various voltages and/or doping polarities can be reversed in specific embodiments, providing, for example, electron generation and electrons acting as majority carriers.

Figure 2:
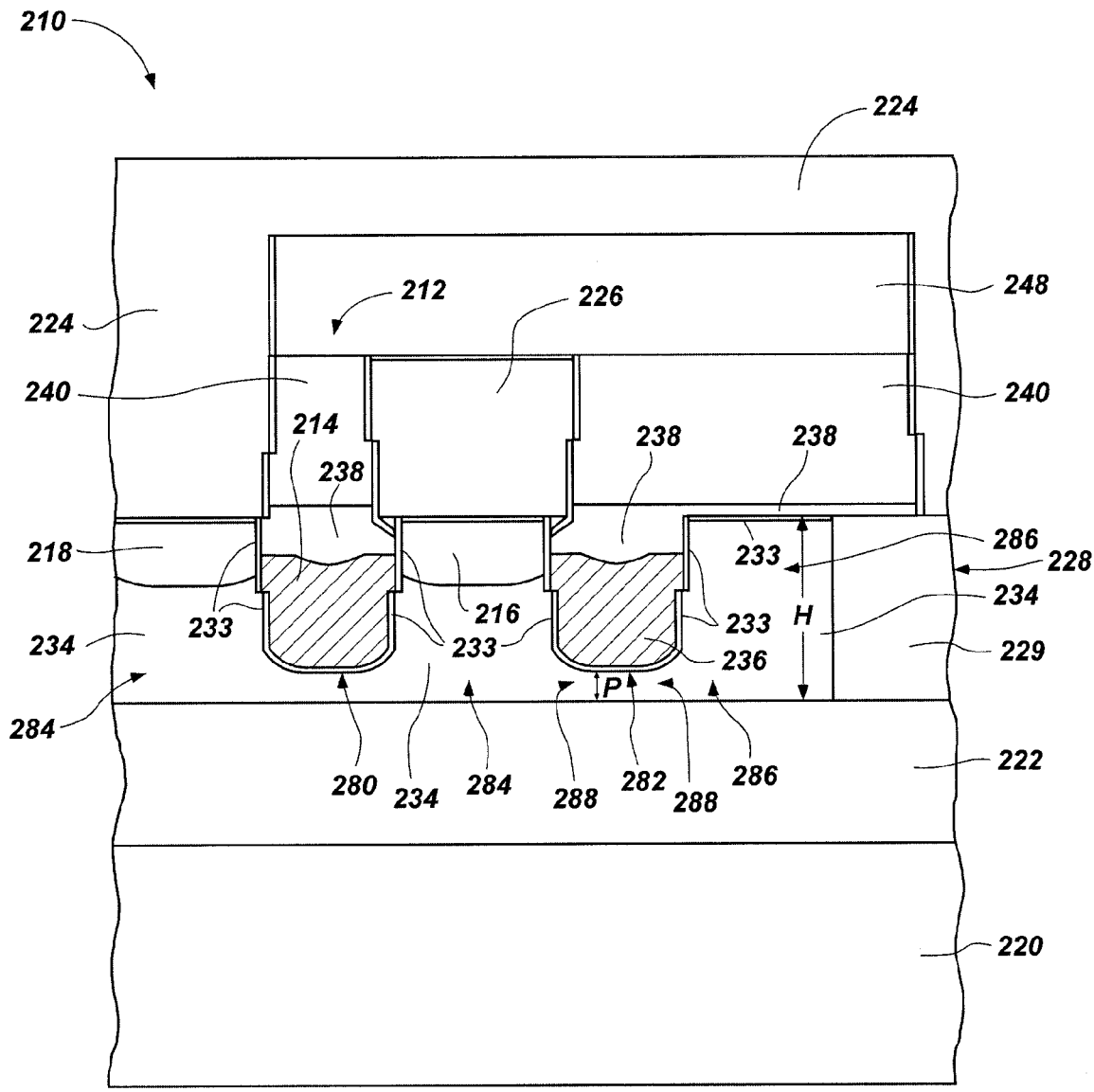
FIG. 2 is a cross-sectional view of a memory cell, in accordance with an embodiment of the present invention.

FIG. 2 is a cross-sectional view of a memory cell 210 including a floating body, in accordance with various embodiments of the present invention. As illustrated in FIG. 2, memory cell 210 includes a transistor 212 having an active gate 214, a source 216, and a drain 218. Additionally, memory cell 210 includes region 234, which may comprise silicon, overlying a buried insulator 222. As illustrated, active gate 214 is positioned within a first recess 280 formed in region 234. Transistor 212 may be formed over buried insulator 222, which may overlie a substrate 220. For example only, and not by way of limitation, buried insulator 222 may comprise a buried oxide (BOX) and substrate 220 may comprise a bulk silicon substrate.

Furthermore, memory cell 210 includes a bias gate 236 positioned within a second recess 282 formed within region 234. For example only, bias gate 236 may comprise polysilicon or any other metal. Additionally, memory cell 210 may comprise a dielectric material 233 formed along a surface of first recess 280 adjacent to region 234 and along a surface of second recess 282 adjacent to region 234. Moreover, dielectric material 233 may be formed over a portion of region 234 between second recess 282 and a shallow trench isolation (STI) region 228, which may comprise a dielectric material 229. Memory cell 210 may also include dielectric 238 (e.g., silicon nitride) overlying each of shallow trench isolation (STI) region 228 and dielectric material 233 formed over a portion of region 234. Furthermore dielectric 238 (e.g., silicon nitride) may overlie each of bias gate 236 within second recess 282 and active gate 214 within first recess 280.

Region 234 may include a first portion 284 adjacent active gate 214, drain 218, and source 216. Furthermore, region 234 may include a second portion 286 adjacent bias gate 236 and remote from active gate 214, drain 218, and source 216. Second portion 286 may also be referred to hereinafter as a "charge storage region." Moreover, first portion 284 may be coupled to second portion 286 via a passage 288 positioned between a bottom end of bias gate 236 and a bottom surface of region 234. For example only, and not by way of limitation, passage 288 may have a height P in a range of, for example only, substantially 20 to 75 nanometers. Collectively, first portion 284, passage 288, and second portion 286 may define a floating body of memory cell 210.

Memory cell 210 may also include an oxide region 240 overlying silicon nitride 238. Furthermore, a common source line 226 may be formed through oxide region 240 and operably coupled to source 216. Memory cell 210 may also include a digit line 224 overlying an oxide region 248 and extending through a channel formed in each of oxide region 248 and oxide region 240 to operably couple to drain 218.

As described more fully below, during a contemplated operation of memory cell 210, bias gate 236 may be operably coupled to a bias voltage and, more specifically, a negative bias voltage. Therefore, during operation, second portion 286 in conjunction with dielectric material 233 formed along an outer surface of second recess 282, STI region 228, and bias gate 236 may collectively function as a capacitor. As a result, holes generated within the floating body (i.e., first portion 284, passage 288, and second portion 286) may be attracted to, and stored within, second portion 286. Consequently, during operation of memory cell 210, charges may be stored remote from each of source 216 and drain 218 and, therefore, any tendency toward charge recombination may be decreased relative to conventional floating body memory cells. Furthermore, coupling second portion 286 to first portion 284 via passage 288 may restrict the number of charges moving into or moving out of second portion 286 during operation of memory cell 210. As a result, charge retention may be enhanced compared to conventional floating body memory cells. Moreover, as configured, memory cell 210 may include a floating body having a larger storage area in comparison to a floating body of a conventional prior art structure. Consequently, this may enable more charge to be stored and, therefore, minimize the signal fluctuation due to any lost charge. As a result, memory cell 210 may provide an enhanced signal in comparison to conventional structures. Additionally, it should be noted that a height H of region 234 may be increased and, therefore, an area of charge storage region 286 may be increased to enable a greater amount of charge to be stored within charge storage region 286.

Figure 3:
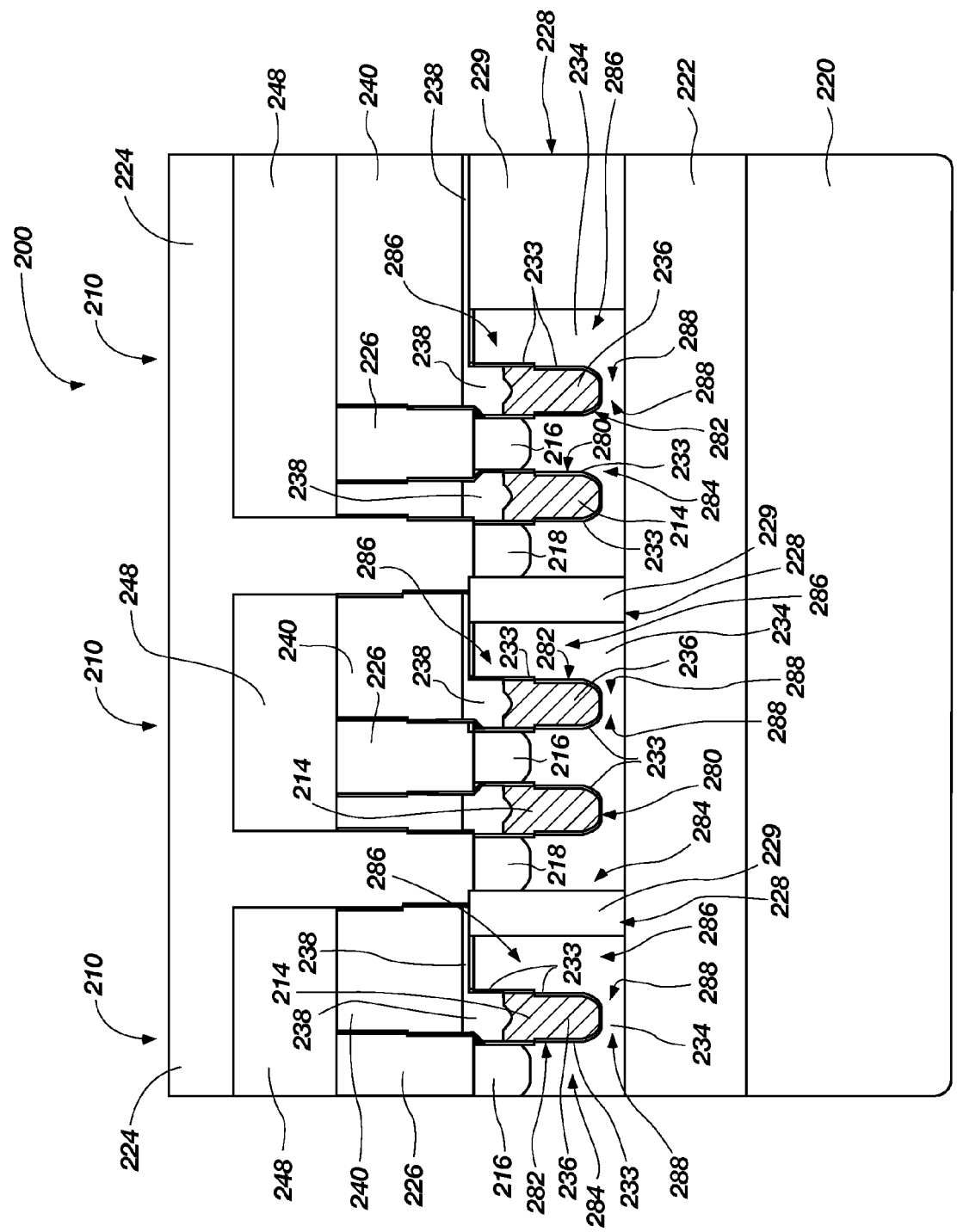
FIG. 3 is a cross-sectional view of a portion of a memory array including a plurality of memory cells, according to an embodiment of the present invention.

FIG. 3 is a cross-sectional view of a portion of a memory array 200 including a plurality of memory cells 210, according to an embodiment of the present invention. Like numerals have been used to identify like features in FIGS. 2 and 3.

With reference to FIGS. 4A-10B, a method of forming a memory array including a plurality of memory cells according to various embodiments of the present invention will now be described. In one embodiment, as depicted in the plan view illustrated in FIG. 4A and the cross-sectional view illustrated in FIG. 4B, a structure including buried insulator 222 over substrate 220 may be provided. As mentioned above, buried insulator 222 may comprise, for example, a buried oxide (BOX) and substrate 220 may comprise, for example, a bulk silicon substrate. Moreover, for example only, buried insulator 222 may have a vertical thickness in a range of substantially 100 to 300 nanometers. Furthermore, the structure may include region 234 overlying buried insulator 222. As mentioned above, region 234 may comprise silicon and may have a height H in a range of, for example only, substantially 50 to 200 nanometers. Furthermore, the structure may include shallow trench isolation (STI) regions 228 formed through region 234. STI regions 228 may be formed using a reactive ion etching (RIE) process or other suitable etching processes known by one having ordinary skill in the art. A dielectric material 229 such as, by way of example only, silicon dioxide ($SiO_2$), spin-on-glass (SOG), or other suitable dielectric material may be formed within each STI region 228. A top dielectric material 229 may then be planarized by an abrasive process such as chemical mechanical planarization (CMP). Furthermore, it should be noted that prior to forming a dielectric material 229 within (STI) regions 228, the side walls of region 234 adjacent (STI) regions 228 may be oxidized to repair any damage as a result of forming STI regions 228.

With reference to the plan view illustrated in FIG. 5A and the cross-sectional view illustrated in FIG. 5B, first recesses 280 and second recesses 282 may be etched into region 234. For example only, first recesses 280 and second recesses 282 may be etched into region 234 using an RIE process or any other etching process known by one having ordinary skill in the art. For example only, and not by way of limitation, first recesses 280 and second recesses 282 may be etched into region 234 to a specific depth so as to leave substantially 20 to 75 nanometers of region 234 between a bottom surface of region 234 and a bottom end of each of first recesses 280 and second recesses 282.

Moreover, dielectric material 233 may be formed over a top surface of region 234 and along a surface of each of first recesses 280 and second recesses 282. For example, according to one embodiment, dielectric material 233 may be formed by selectively oxidizing a top surface of region 234 and a surface of region 234 adjacent each first recess 280 and each second recess 282. According to another embodiment, dielectric material 233 may be formed by any known, suitable deposition process. For example only, dielectric material 233 may comprise a high-K dielectric material in comparison to silicon dioxide.

Figure 6B:
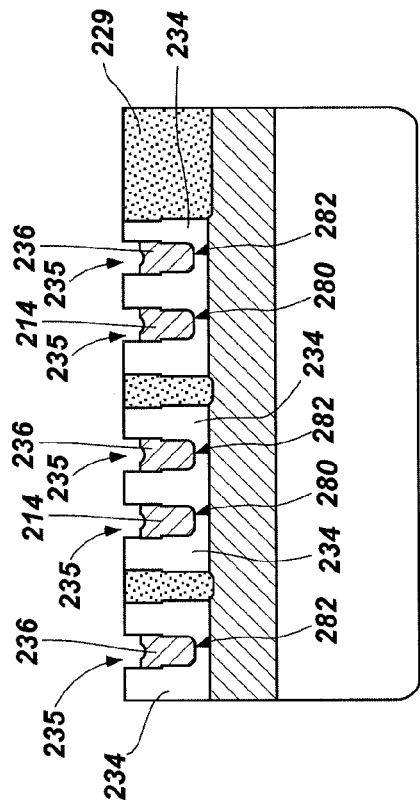
FIG. 6B is a cross-sectional view of further formation of the structure of FIG. 5B, in accordance with an embodiment of the present invention.
Figure 6A:
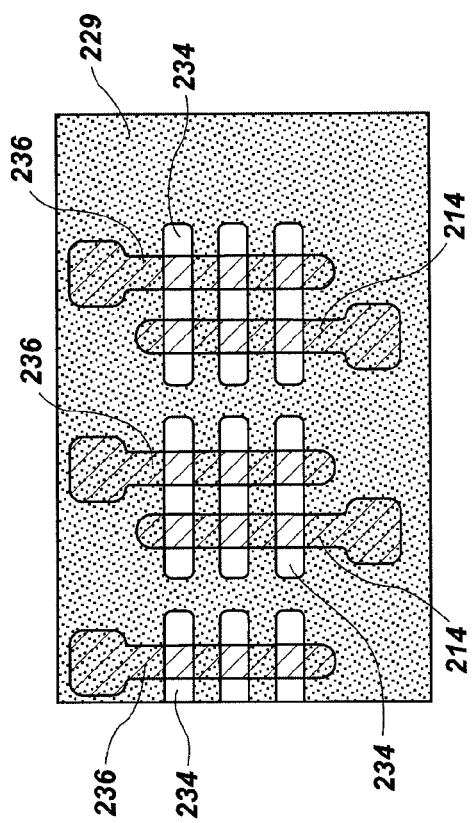
FIG. 6A is a plan view of further formation of the structure of FIG. 5A, in accordance with an embodiment of the present invention.

Thereafter, as depicted in the plan view illustrated in FIG. 6A and the cross-sectional view illustrated in FIG. 6B, active gates 214 may be formed within each first recess 280 and bias gates 236 may be formed within each second recess 282. Each of active gates 214 and bias gates 236 may comprise, for example, a metal such as titanium nitride (TiN), tantalum nitride (TaN), any combination thereof, or any other metal. For example only, and not by way of limitation, bias gates 236 and active gates 214 may each be formed by any known metal silicide deposition process or any other process known by one having ordinary skill in the art. Thereafter, a portion of each active gate 214 within first recess 280 and each bias gate 236 within second recess 282 may be etched by any process known by one of ordinary skill in the art to form depressions 235. Depressions 235 may be formed by, for example only, a blanket RIE process. Moreover, by way of example only, depressions 235 may be formed to a depth of substantially 20 to 75 nanometers below the top surface of region 234.

Figure 7B:
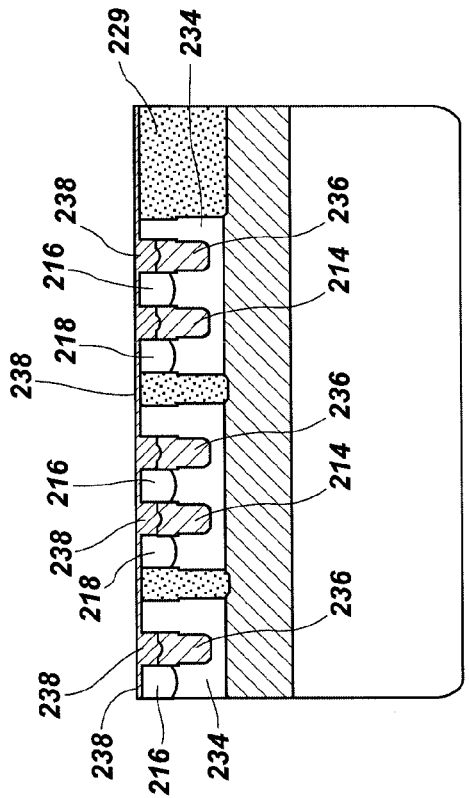
FIG. 7B is a cross-sectional view of further formation of the structure of FIG. 6B, in accordance with an embodiment of the present invention.
Figure 7A:
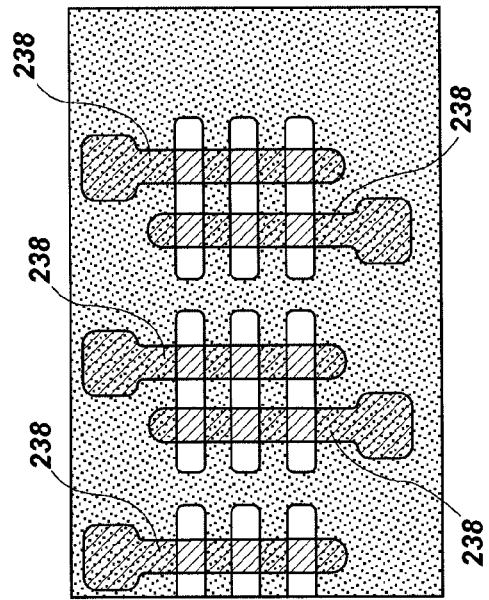
FIG. 7A is a plan view of further formation of the structure of FIG. 6A, in accordance with an embodiment of the present invention.

Subsequently, as depicted in the plan view illustrated in FIG. 7A and the cross-sectional view illustrated in FIG. 7B, source 216 and drain 218 may be formed within region 234 by any process known by one having ordinary skill in the art. Furthermore, a dielectric 238 which may comprise, for example, silicon nitride may be formed, by any known process, over each of region 234 and dielectric material 229. Dielectric 238 may also be formed within each depression 235 over bias gate 236 and active gate 214.

Figure 8A:
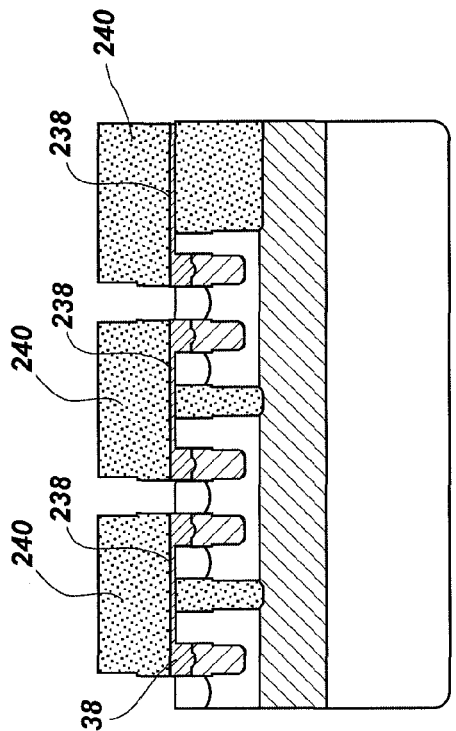
FIG. 8A is a plan view of further formation of the structure of FIG. 7A, in accordance with an embodiment of the present invention.
Figure 8B:
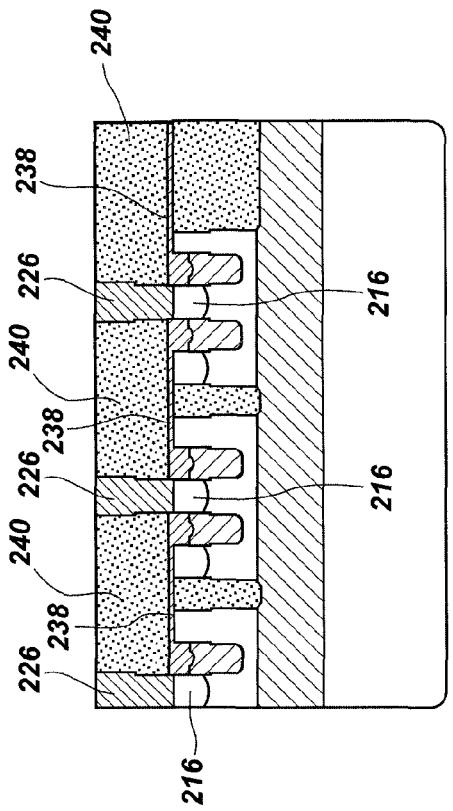
FIG. 8B is a cross-sectional view of further formation of the structure of FIG. 7B, in accordance with an embodiment of the present invention.
Figure 9A:
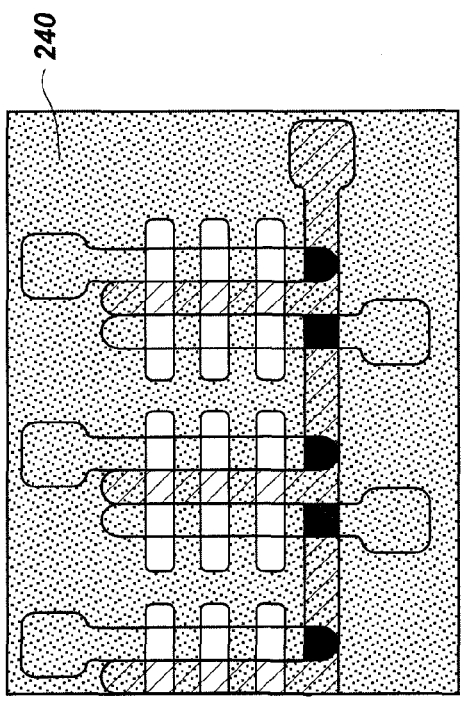
FIG. 9A is a plan view of further formation of the structure of FIG. 8A, in accordance with an embodiment of the present invention.
Figure 9B:
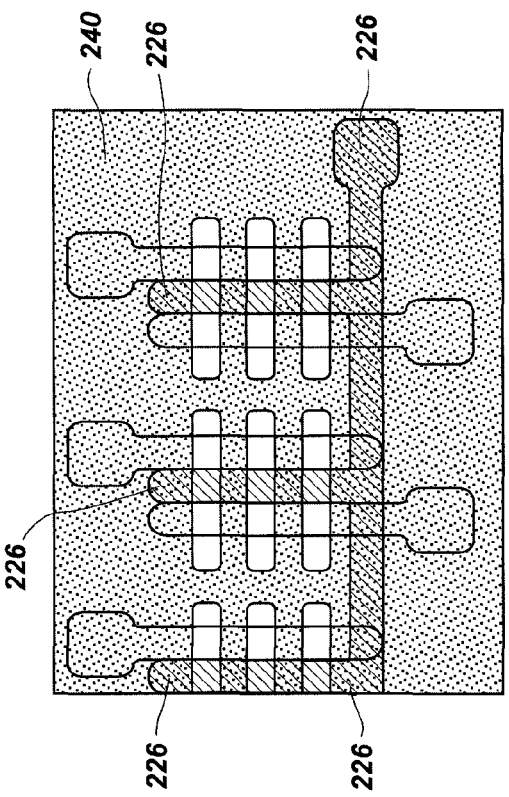
FIG. 9B is a cross-sectional view of further formation of the structure of FIG. 8B, in accordance with an embodiment of the present invention.
Figure 10B:
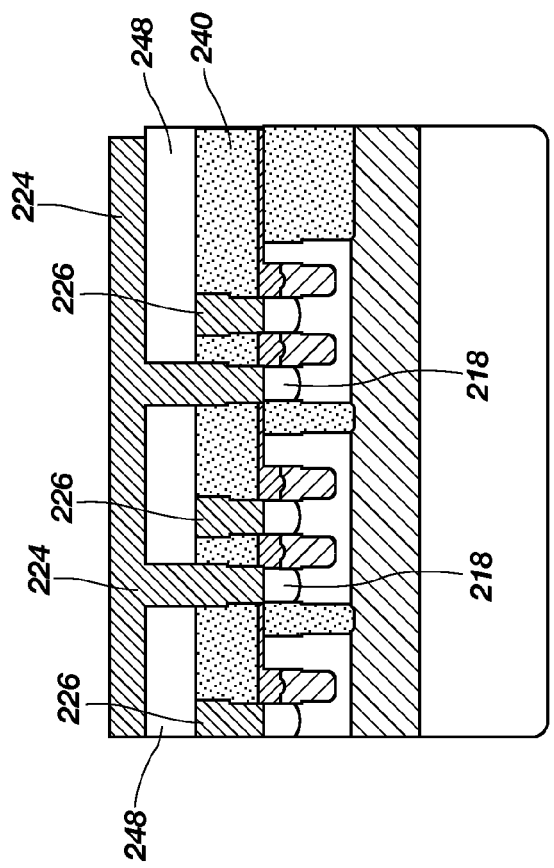
FIG. 10B is a cross-sectional view of further formation of the structure of FIG. 9B, in accordance with an embodiment of the present invention.
Figure 10A:
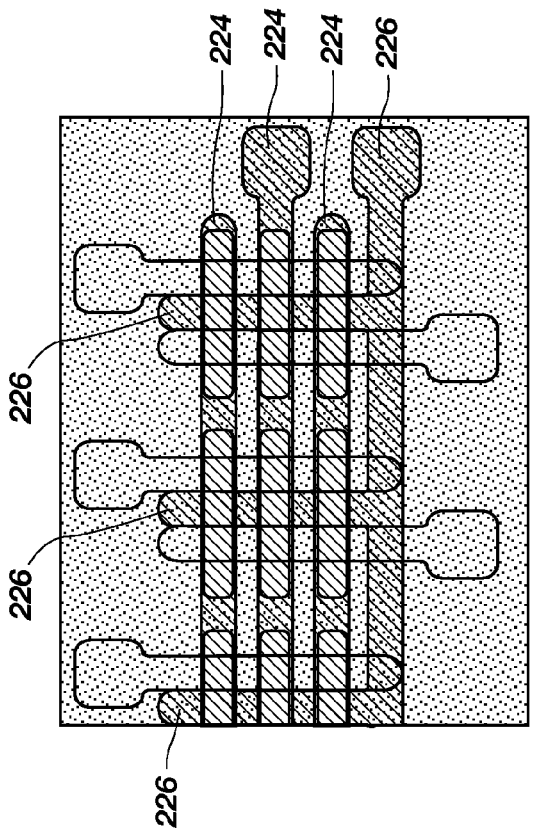
FIG. 10A is a plan view of further formation of the structure of FIG. 9A, in accordance with an embodiment of the present invention.

Furthermore, with reference to the plan view illustrated in FIG. 8A and the cross-sectional view illustrated in FIG. 8B, using any known process, oxide region 240 may be formed over dielectric 238. Subsequently, as illustrated in FIGS. 9A and 9B, a conventional damascene process may be used to create common source lines 226 extending through each of oxide region 240 and dielectric 238 and coupled to sources 216. A top of each common source line 226 may then be planarized by an abrasive process such as a CMP process. For example only, common source lines 226 may comprise titanium nitride (TiN), tantalum nitride (TaN), tungsten (W), any combination thereof, or any other metal. Thereafter, with reference to the plan view illustrated in FIG. 10A and the cross-sectional view illustrated in FIG. 10B, using any known process, oxide region 248 may be formed over oxide region 240 and common source lines 226. Subsequently, oxide region 248 and oxide region 240 may each be etched by any known etching process such as, for example only, an RIE process, to form a plurality of depressions through each of oxide region 248 and oxide region 240 and over drain regions 218. Digit line 224 may then be formed over oxide region 248, within each depression, and coupled to drains 218, as illustrated in FIG. 10B. For example only, digit line 224 may comprise titanium nitride (TiN), tantalum nitride (TaN), any combination thereof, or any other metal.

Referring to the plan views illustrated in FIGS. 11A and 11C and the cross-sectional views illustrated in FIGS. 11B and 11D, a memory array 400 including a plurality of memory cells 410, in accordance with one or more other embodiments of the present invention, is depicted. FIG. 11C is a plan view rotated ninety degrees with respect to the plan view illustrated in FIG. 11A. Furthermore, FIG. 11D is a cross-sectional view rotated ninety degrees with respect to the cross-sectional view illustrated in FIG. 11B. Moreover, FIG. 11D is taken along lines 11D-11D of FIG. 11C. As illustrated in FIG. 11B, each memory cell 410 includes a transistor 412 having an active gate 414, a source 416, and a drain 418. Transistors 412 may comprise, for example only, a planar transistor, and may be formed by any process known by one having ordinary skill in the art. Transistors 412 may be formed over a buried insulator 422, which may overlie a substrate 420. For example only, and not by way of limitation, buried insulator 422 may comprise a buried oxide (BOX) and substrate 420 may comprise a bulk silicon substrate. Additionally, memory array 400 includes a region 434 which may comprise silicon. Region 434 may include a first portion 484 adjacent to active gate 414, drain 418, and source 416.

As illustrated in FIGS. 11B and 11D, each memory cell 410 may also include a finFET transistor 468 that may be formed by any conventional process. As understood by a person having ordinary skill in the art, a finFET transistor may include a gate region which may be formed into at least a portion of a silicon structure configured to act as a floating body of a memory cell. As a result, the gate region may at least partially wrap around one or more portions of the floating body. As illustrated in FIG. 11D, finFET transistor 468 may include a gate region 470 formed into shallow trench isolation (STI) region 428 and into a portion of region 434 to form a plurality of second portions 486 with region 434. Each second portion 486 may be formed underneath and in vertical alignment with at least a portion of gate region 470 and first portion 484 may be vertically offset from gate region 470. Second portion 486 may also be referred to hereinafter as a "charge storage region." Collectively, first portion 484 and second portion 486 may define a floating body of memory cell 410.

It should also be noted that, although gate region 470, as illustrated in FIG. 11D, does not extend through an entire depth of region 434, gate region 470 may extend through an entire depth of region 434 to abut a top surface of buried insulator 422. As a result gate region 470 may be enlarged and, therefore, a greater area configured to attract a charge may be provided.

Memory array 400 may also include silicon nitride 438 overlying each of shallow trench isolation (STI) regions 428 and region 434. STI regions 428 (comprising dielectric material 429) and silicon nitride 438 may each be formed by any known processes, such as the processes described above with reference to FIGS. 4A-7B. Furthermore, conventional processing techniques, such as the processing techniques described above with reference to FIGS. 8A-10B, may be used to form common source lines and a digit line over each memory cell 410 to complete a memory array structure.

As described more fully below, during a contemplated operation of memory cell 410, gate region 470 of finFet transistor 468 may be operably coupled to a bias voltage and, more specifically, a negative bias voltage. Therefore, during operation, each second portion 486 in conjunction with STI region 428, and gate region 470 may function as a capacitor. Furthermore, because gate region 470, which is coupled to a bias voltage, is formed partially around each second portion 486, holes generated within the floating body (i.e., first portion 484 and second portion 486) may be attracted to and stored within second portion 486. Consequently, charge recombination may be decreased and charge retention may be enhanced relative to conventional floating body memory cells. Moreover, as configured, memory cell 410 may include a floating body having a larger storage area in comparison to a floating body of a conventional prior art structure. As a result, this may enable more charge to be stored and, therefore, minimize the signal fluctuation due to any lost charge. Therefore, memory cell 410 may provide an enhanced signal in comparison to conventional structures. Additionally, it should be noted that a height X (see FIG. 11D) of region 434 may be increased and, therefore, an area of charge storage region 486 may be increased to enable a greater amount of charge to be stored within charge storage region 486. Additionally, it should be noted that, as illustrated in FIG. 11B, a portion of gate region 470 may overlie and be in vertical alignment with a portion of STI region 428, as indicated by numeral 487. Stated another way, a portion of gate region 470 may overlap a portion of STI region 428. Overlapping a portion of STI region 428 with gate region 470 may increase the capacitive coupling of second portion 486.

Figure 12B:
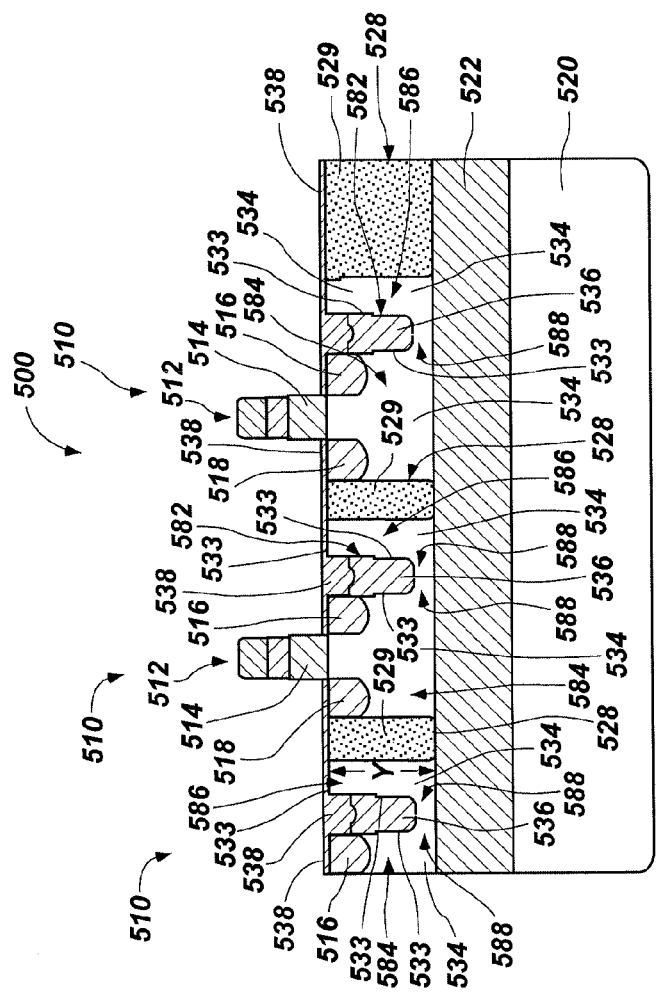
FIGS. 12A and 12B respectively illustrate a plan view and a cross-sectional view of a formation of yet another structure, in accordance with another embodiment of the present invention.
Figure 12A:
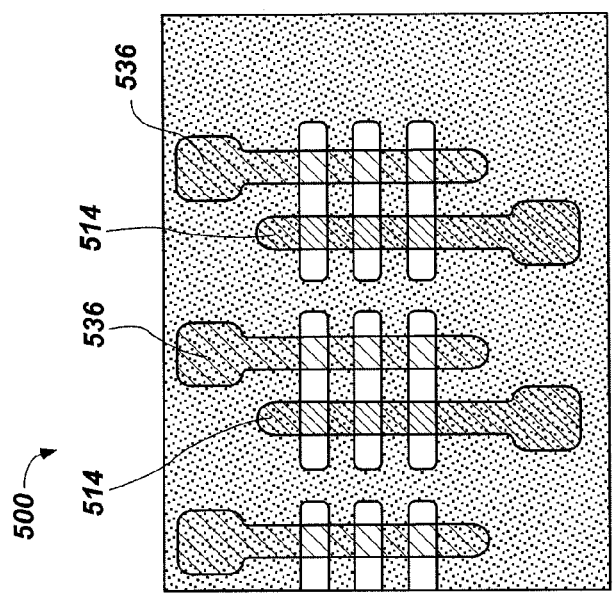

Referring to the plan view illustrated in FIG. 12A and the cross-sectional view illustrated in FIG. 12B, a memory array 500 including a plurality of memory cells 510, in accordance with yet one or more other embodiments of the present invention, is depicted. As illustrated in FIGS. 12A and 12B, each memory cell 510 includes a transistor 512 having an active gate 514, a source 516, and a drain 518. Transistors 512 may comprise, for example, a planar transistor, and may be formed by any process known by one having ordinary skill in the art. Transistor 512 may be formed over a buried insulator 522, which may overlie a substrate 520. By way of example only, and not by way of limitation, buried insulator 522 may comprise a buried oxide (BOX) and substrate 520 may comprise a bulk silicon substrate. Additionally, memory array 500 includes a region 534 which may comprise silicon. As illustrated, each memory cell 510 may include a bias gate 536 positioned within a recess 582 formed in region 534. By way of example only, bias gates 536 may comprise polysilicon or any other metal.

Additionally, each memory cell 510 may comprise a dielectric material 533 formed around a surface of recess 582 adjacent region 534. Moreover, dielectric material 533 may also be formed over a portion of region 534 between recess 582 and a shallow trench isolation (STI) region 528. For example, STI region 528 may comprise a dielectric material 529. Each memory cell 510 may also include silicon nitride 538 overlying each shallow trench isolation (STI) region 528 and each region 534. Furthermore silicon nitride 538 may overlie each bias gate 536 within recess 582. Recesses 582, dielectric material 533, STI regions 528, and silicon nitride 538 may each be formed by any known processes, such as the processes described above with reference to FIGS. 4A-7B.

Region 534 may include a first portion 584 adjacent active gate 514, drain 518, and source 516. Furthermore, region 534 may include a second portion 586 adjacent bias gate 536 and remote from active gate 514, drain 518, and source 516. Second portion 586 may also be referred to hereinafter as a "charge storage region." Moreover, first portion 584 may be coupled to second portion 586 via a passage 588 positioned between a bottom end of bias gate 536 and a bottom surface of region 534. Collectively, first portion 584, passage 588, and second portion 586 may define a floating body of memory cell 510. Furthermore, conventional processing techniques, such as the processing techniques described with reference to FIGS. 8A-10B may be used to form common source lines and a digit line over each memory cell 510 to complete a memory array structure.

As described more fully below, during a contemplated operation of memory cell 510, bias gate 536 may be operably coupled to a bias voltage and, more specifically, a negative bias voltage. Therefore, during operation, second portion 586 in conjunction with dielectric material 533 formed along an outer surface of recess 582, STI region 528, and bias gate 536 may collectively function as a capacitor. As a result, holes generated within the floating body (i.e., first portion 584, passage 588, and second portion 586) may be attracted to and stored within second portion 586. Consequently, during operation of memory cell 510, charges may be stored remote from each of source region 516 and drain region 518 and, therefore, any tendency toward charge recombination may be decreased relative to conventional floating body memory cells. Furthermore, coupling second portion 586 to first portion 584 via passage 588 may restrict the number of charges moving into or moving out of second portion 586 during operation of memory cell 510. As a result, charge retention may be enhanced compared to conventional floating body memory cells. Moreover, as configured, memory cell 510 may include a floating body having a larger storage area in comparison to a floating body of a conventional prior art structure. Consequently, this may enable more charge to be stored and, therefore, minimize the signal fluctuation due to any lost charge. As a result, memory cell 510 may provide an enhanced signal in comparison to conventional structures. Additionally, it should be noted that a height Y of region 534 may be increased and, therefore, an area of charge storage region 586 may be increased to enable a greater amount of charge to be stored within charge storage region 586.

Figure 13:
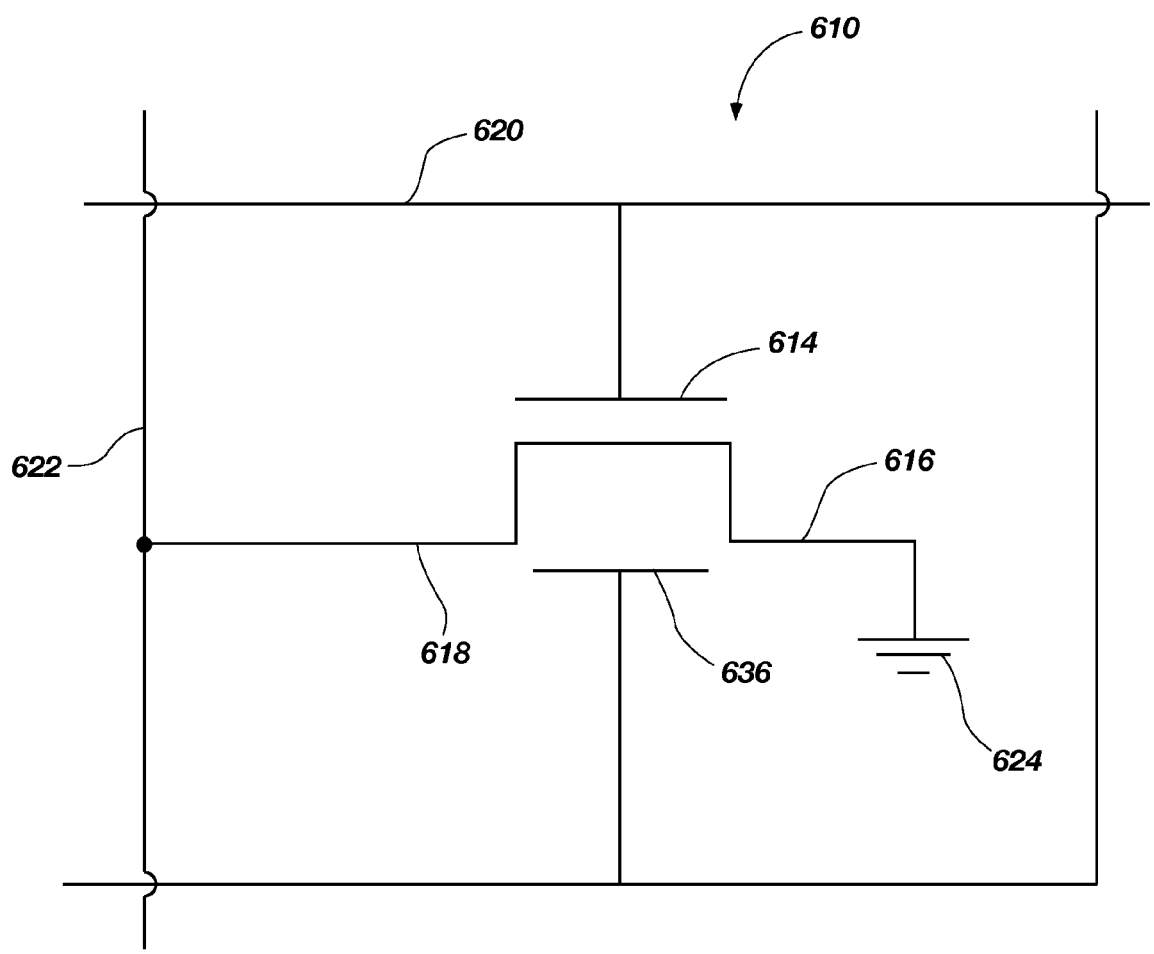
FIG. 13 is a circuit diagram of a memory cell, in accordance with an embodiment of the present invention.

With reference to FIG. 13, various operations (i.e., erasing or writing) of a memory cell will now be described. FIG. 13 illustrates a circuit diagram of a memory cell 610 that comprises any previously described memory cell 210, 410, or 510 (not shown). Memory cell 610 includes a gate 614 coupled to a wordline 620, a drain 618 coupled to a digit line 622, and a source 616 coupled to a ground voltage 624. Additionally, memory cell 610 includes a bias gate 636 configured to be operably coupled to a bias voltage.

Using a gate-induced drain leakage (GIDL) current, as understood by one of ordinary skill in the art, a logic "1" may be written to memory cell 610 by applying a first positive voltage (e.g., 2.5 volts) to gate 614 of memory cell 610 and a second positive voltage (e.g., 1.8 volts) having a lower potential than the first positive voltage to drain 618 of memory cell 610. Furthermore, bias gate 636 may be operably coupled to a bias voltage and, more specifically, a negative bias voltage. For example only, bias gate 636 may be operably coupled to a negative bias voltage in the range of substantially −1.0 to −2.0 volts. Additionally, source 616 may be operably coupled to ground voltage 624. As will be appreciated by one of ordinary skill in the art, a high gate-to-drain voltage (Vgd) may create holes within a floating body of memory cell 610 that may be attracted to a charge storage area (see e.g., charge storage region 286 of FIG. 2, charge storage region 486 of FIGS. 11B and 11D, or charge storage region 586 of FIG. 12B) due at least partially to the negative potential of bias gate 636.

Moreover, a logic "1" may be erased from memory cell 610 by applying a positive voltage (e.g., 1.0 volts) to gate 614 of memory cell 610 and a negative voltage (e.g., −1.8 volts) to drain 618 of memory cell 610. Furthermore, bias gate 636 may be operably coupled to a bias voltage and, more specifically, a negative bias voltage. By way of example only, bias gate 636 may be operably coupled to a negative bias voltage in the range of substantially −1.0 to −2.0 volts. Additionally, source 616 may be operably coupled to ground voltage 624. As will be appreciated by one of ordinary skill in the art, an inverted channel and a negative drain potential will remove holes from within a floating body of memory cell 610. Furthermore, to read a charge stored within memory cell 610, a first positive voltage (e.g., 1.0 volt) may be applied to gate 614 of memory cell 610. Additionally, a second positive voltage (e.g., 0.3 volts) having a potential less than the first positive voltage applied to gate 614 of memory cell 610 may be applied to drain 618 of memory cell 610.

Figure 14:
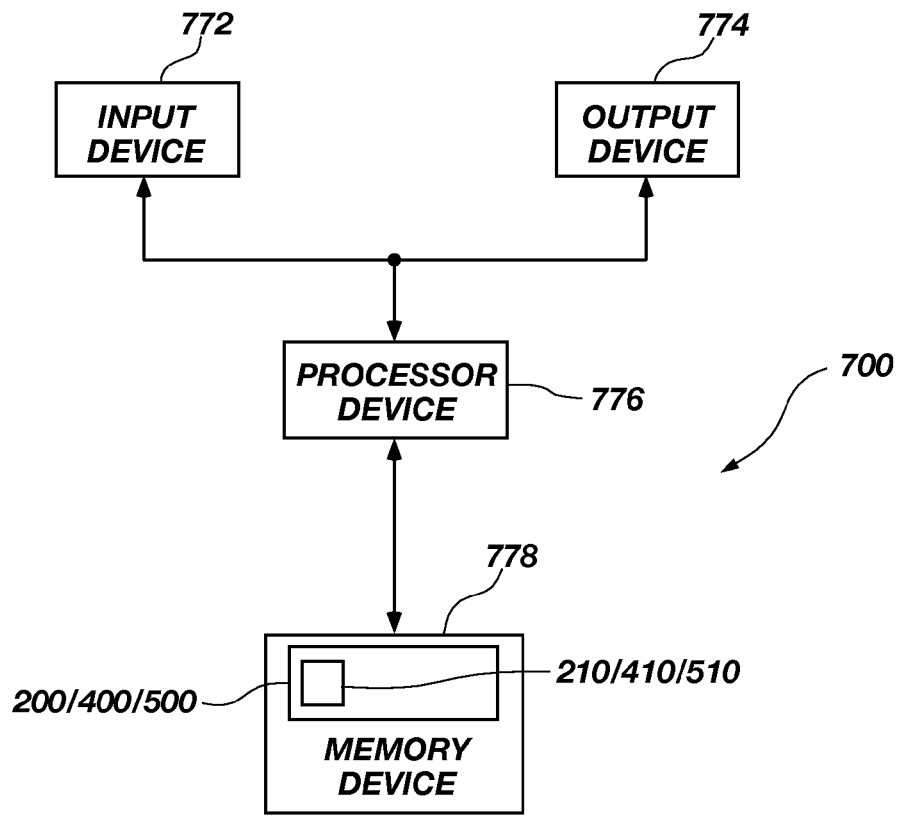
FIG. 14 is a block diagram of an electronic system, according to an embodiment of the present invention.
Figure 15:
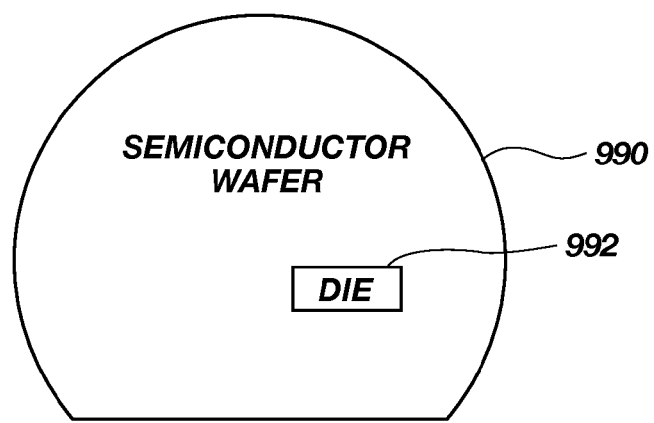
FIG. 15 is a diagram of a semiconductor wafer including an integrated circuit die incorporating a memory cell of one or more of the previous embodiments, in accordance with an embodiment of the present invention.

FIG. 14 is a block diagram of an electronic system, in accordance with an embodiment of the present invention. Electronic system 700 includes an input device 772, an output device 774, and a memory device 778, all coupled to a processor device 776. Memory device 778 incorporates at least one memory array 200, 400, 500 including at least one memory cell 210, 410, 510 of one or more of the preceding embodiments of the present invention. FIG. 15 is a diagram of a semiconductor wafer 990 including an integrated circuit die 992 incorporating the memory array and memory cells of one or more of the previous embodiments, in accordance with a further embodiment of the present invention.

Embodiments of the invention offer advantages over conventional memory technology and structures to implement same. For example, a small capacitor structure is employed in operation of the floating body. The floating body is remote from the source/drain regions, thus minimizing disturbance during operation. The bias gate, dielectric and floating body can be modeled independently from the FET, to minimize charge loss during operation. The technology is easily scalable, and full-pitch processes, half-pitch processes, or any combination thereof may be employed to implement. In addition, the devices fabricated are stackable. Further, feature size (CD) may be reduced to 8F2 or smaller using pitch reduction technology.

CONCLUSION

Various embodiments of the present disclosure are described above and directed toward embodiments of a memory cell, methods of forming a memory cell, a memory device including a memory array having a plurality of memory cells, methods of operating a memory array, and an electronic system including at least one memory device including a memory array having a plurality of memory cells. In at least one embodiment, a memory cell may comprise a transistor including a source, a drain, and a gate positioned between the source and the drain. Further, the memory cell may include silicon having a first portion located adjacent each of the source and the drain, and a second portion distant each of the source and the drain. The silicon may include a passage coupling the first portion to the second portion. Moreover, the memory cell may include a bias gate recessed into the silicon and positioned between the first portion and the second portion. The bias gate may be configured for operably coupling to a bias voltage. The memory cell may also include a dielectric material at least partially surrounding the bias gate, and an isolation region adjacent to the silicon and comprising another dielectric material. The second portion may be positioned between the isolation region and the bias gate.

In at least one other embodiment, a memory cell may comprise a transistor having a drain and a source each formed in silicon and a gate positioned between the drain and the source. The memory cell may also include a bias gate recessed into the silicon and positioned between an isolation region and the transistor. The bias gate may be configured to be operably coupled to a bias voltage. Additionally, the memory cell may include a floating body within the silicon and having a first portion adjacent the source and the drain and a second portion coupled to the first portion. The first portion may be vertically offset from the bias gate and the bias gate may be formed adjacent the second portion.

Other embodiments of the invention may include methods of forming a memory cell. A method may comprise forming a transistor having a source and drain formed in silicon and a gate positioned between the source and the drain. Additionally, the method may include forming a recess into but not through the silicon and positioned between the transistor and an isolation region formed through the silicon. Further, the recess may be remote from the isolation region. The method may also include forming a dielectric along a surface of the recess and adjacent the silicon. The method may also comprise forming a conductive material at least partially within the recess.

One or more other embodiments may comprise methods of operating a memory array including a plurality of memory cells. A method may include applying a bias voltage to a bias gate adjacent a charge storage region of each memory cell of the plurality. The method may also include performing an operation on a memory cell comprising a transistor by one of programming a charge to an associated charge storage region within a floating body of the memory cell and reading a charge from the associated charge storage region. The associated charge storage region may be positioned adjacent an isolation region, vertically offset from the transistor, and coupled to another region within the floating body. Additionally, the another region may be adjacent the transistor.

In yet further embodiments, the disclosure includes a memory device comprising a memory array including a plurality of memory cells according to one or more of the previously described embodiments. Still, other embodiments of the disclosure include electronic systems. One or more embodiments of such systems may comprise at least one processor and at least one memory device including a plurality of memory cells according to one or more of the previously described embodiments.

Specific embodiments have been shown by way of non-limiting example in the drawings and have been described in detail herein; however, the various embodiments may be susceptible to various modifications and alternative forms. It should be understood that the invention is not limited to the particular forms disclosed. Rather, the invention encompasses all modifications, equivalents, and alternatives falling within the scope of the following appended claims and their legal equivalents.

What is claimed is:

1. A memory cell, comprising:
a transistor including a source, a drain, and a gate positioned between the source and the drain;
silicon including a first portion located adjacent each of the source and the drain, a second portion distant each of the source and the drain, and a passage coupling the first portion to the second portion;
a bias gate recessed into the silicon and positioned between the first portion and the second portion and configured for operably coupling to a bias voltage;
a dielectric material at least partially surrounding the bias gate; and
an isolation region adjacent the silicon and comprising another dielectric material, wherein the second portion is positioned between the isolation region and the bias gate.

2. The memory cell of claim 1, wherein the gate of the transistor is recessed into the silicon.

3. The memory cell of claim 2, wherein the dielectric material at least partially surrounds the gate of the transistor recessed into the silicon.

4. The memory cell of claim 1, wherein the silicon has a height in the range of substantially 50 to 200 nanometers.

5. The memory cell of claim 1, wherein the dielectric material comprises a high dielectric constant relative to a dielectric constant of silicon dioxide.

6. The memory cell of claim 1, wherein the bias gate is configured for operably coupling to a negative bias voltage.

7. The memory cell of claim 1, wherein the bias gate comprises at least one of polysilicon and a metal.

8. The memory cell of claim 1, wherein the silicon overlies and is adjacent to a buried insulator.

9. The memory cell of claim 8, wherein the bias gate is formed within a recess formed into the silicon, wherein a dielectric is formed over at least a portion of the second portion and within the recess overlying the bias gate.

10. The memory cell of claim 1, wherein the passage has a vertical thickness extending from a bottom end of the bias gate to a bottom surface of the silicon.

11. The memory cell of claim 1, wherein the passage has a height in the range of substantially 20 to 75 nanometers.

12. A memory cell, comprising:
a transistor comprising a drain and a source each formed in silicon and a gate positioned between the drain and the source;
a bias gate recessed into the silicon and positioned between an isolation region and the transistor and configured to be operably coupled to a bias voltage; and
a floating body within the silicon and having a first portion adjacent the source and the drain and vertically offset from the bias gate and a second portion coupled to the first portion, wherein the bias gate is formed adjacent the second portion.

13. The memory cell of claim 12, wherein the second portion is vertically aligned with at least a portion of the bias gate.

14. The memory cell of claim 12, wherein the bias gate is a gate of a finFET transistor.

15. A method of forming a memory cell, comprising:
forming a transistor having a source and a drain formed in silicon and a gate positioned between the source and the drain;
forming a recess into but not through the silicon and positioned between the transistor and an isolation region formed through the silicon, wherein the recess is remote from the isolation region;
forming a dielectric along a surface of the recess and adjacent to the silicon; and
forming a conductive material at least partially within the recess.

16. The method of claim 15, wherein forming a recess into but not through the silicon comprises forming the recess into but not through the silicon having a vertical thickness in a range of substantially 50 to 200 nanometers.

17. The method of claim 15, wherein forming a transistor comprises forming the transistor having the gate recessed into but not through the silicon.

18. The method of claim 15, further comprising forming another dielectric over at least a portion of the silicon between the recess and the isolation region, over the isolation region, and within the recess overlying the conductive material.

19. The method of claim 15, wherein forming a recess into but not through the silicon comprises forming a recess into but not through the silicon, leaving a portion of the silicon between a bottom end of the recess and a top surface of a buried insulator positioned underneath the silicon.

20. The method of claim 19, wherein leaving a portion of the silicon between a bottom end of the recess and a top surface of a buried insulator comprises leaving a portion of the silicon having a vertical thickness in a range of substantially 20 to 75 nanometers between the bottom end of the recess and the top surface of the buried insulator.

21. A method of operating a memory array including a plurality of memory cells, comprising:
applying a bias voltage to a bias gate adjacent a charge storage region of each memory cell of the plurality; and
performing an operation on a memory cell comprising a transistor including a gate, a source, and a drain by one of programming a charge to an associated charge storage region within a floating body of the memory cell and reading a charge from the associated charge storage region positioned adjacent an isolation region, vertically offset from the transistor, and coupled to another region within the floating body adjacent each of the gate, the source, and the drain.

22. The method of claim 21, wherein applying a bias voltage to a bias gate comprises applying a negative bias voltage to the bias gate.

23. A memory device, comprising:
a memory array including a plurality of memory cells, each memory cell comprising:
a transistor comprising a drain formed in silicon, a source formed in the silicon, and a gate positioned between the drain and the source;
a bias gate recessed into the silicon and positioned between an isolation region and the source and configured to be operably coupled to a bias voltage;
a dielectric at least partially surrounding the bias gate; and
a floating body within the silicon and having a first portion adjacent the source and the drain, a second portion positioned between the isolation region and the bias gate and distant from the source and the drain, and a passage extending proximate the bias gate and coupling the first portion to the second portion.

24. An electronic system, comprising:
at least one processor; and
at least one memory device including a plurality of memory cells, each memory cell of the plurality comprising:
a transistor comprising a drain and a source each formed in silicon and a gate positioned between the drain and the source;
a first portion of the silicon adjacent the source and the drain and vertically offset from the gate;
a bias gate configured to be operably coupled to a bias voltage and formed adjacent the first portion and the transistor; and
a second portion of the silicon coupled to the first portion, vertically offset from the transistor, and positioned adjacent the bias gate and an isolation region.

25. The electronic system of claim 24, wherein the second portion is vertically aligned with at least a portion of the bias gate.

* * * * *

UNITED STATES PATENT AND TRADEMARK OFFICE
CERTIFICATE OF CORRECTION

PATENT NO.       : 7,929,343 B2
APPLICATION NO.  : 12/419658
DATED            : April 19, 2011
INVENTOR(S)      : Sanh D. Tang It is certified that error appears in the above-identified patent and that said Letters Patent is hereby corrected as shown below:

In column 14, line 10, in Claim 23, after "cell" insert -- of the plurality --.

Signed and Sealed this
Fourteenth Day of June, 2011

David J. Kappos
*Director of the United States Patent and Trademark Office*